(12) United States Patent
Wall et al.

(10) Patent No.: US 6,294,943 B1
(45) Date of Patent: Sep. 25, 2001

(54) METHOD OF DESIGNING FAIL-SAFE CMOS I/O BUFFERS WHOSE EXTERNAL NODES ACCEPT VOLTAGES HIGHER THAN THE MAXIMUM GATE OXIDE OPERATING VOLTAGE

(75) Inventors: Frederick G. Wall, Garland; Bernhard H. Andresen, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/464,666

(22) Filed: Dec. 15, 1999

Related U.S. Application Data

(60) Provisional application No. 60/114,268, filed on Dec. 30, 1998.

(51) Int. Cl.[7] .......................... H02H 9/00; H03K 19/0185
(52) U.S. Cl. ............................ 327/328; 327/543; 361/90
(58) Field of Search ..................................... 327/108, 112, 327/312, 313, 327, 328, 538, 543; 326/80–83, 14; 361/18, 92, 90, 91.2, 91.5; 307/64

(56) References Cited

U.S. PATENT DOCUMENTS

| | | | |
|---|---|---|---|
| 5,574,609 | * 11/1996 | Leidich | .................................... 361/56 |
| 5,990,705 | * 11/1999 | Lim | ........................................ 326/81 |
| 6,040,708 | * 3/2000 | Blake et al. | ........................... 326/81 |
| 6,147,538 | * 11/2000 | Andresen et al. | .................... 327/309 |

\* cited by examiner

*Primary Examiner*—Timothy P. Callahan
*Assistant Examiner*—Terry L. Englund
(74) *Attorney, Agent, or Firm*—Robert D. Marshall, Jr.; W. James Brady, III; Frederick J. Telecky, Jr.

(57) ABSTRACT

A fail-safe Input/Output buffer bias circuit for digital CMOS chips provides protection for Input/Output buffers which have high voltages applied to the Input/output node and are subjected to power supply failure resulting in a collapsing supply voltage decaying to zero volts while said Input/output circuit has a high voltage remaining applied to its Input/output node. The Input/output buffer bias circuit is comprised of a sensing circuit and a bias generator circuit which acts to drive protection transistors in a manner which optimally minimizes the voltage impressed on input or output devices under all conditions which could persist in the event of $V_{DD}$ supply voltage failure. Protection circuitry holds all three combinations of voltage stress, gate-to-source, gate-to-drain, and drain-to-source voltages, to acceptable levels.

16 Claims, 4 Drawing Sheets

METHOD OF DESIGNING FAIL-SAFE CMOS I/O BUFFERS WHOSE EXTERNAL NODES ACCEPT VOLTAGES HIGHER THAN THE MAXIMUM GATE OXIDE OPERATING VOLTAGE

This application claims priority under 35 USC §119(e)(1) of Provisional Application No. 60/114,268, filed Dec. 30, 1998.

TECHNICAL FIELD OF THE INVENTION

The technical field of this invention is that of integrated circuit input/output buffers and in particular such output buffers that are fail-safe.

BACKGROUND OF THE INVENTION

Complementary metal oxide semiconductor (CMOS) Input/output buffers which perform the interface between a packaged digital device chip and other such device chips must be able to withstand all anticipated conditions which might occur in normal usage as well as some conditions which could occur only under certain system power supply failure modes. One of the latter conditions, well known to designers, is the condition under which the system supply voltage fails and causes voltage stress, originating from an external load, to be impressed on the input, output, or input/output (I/O) buffer circuitry. This application problem has been made even more difficult in sub-micron CMOS circuitry operating on low voltage power supplies (3.3 volts, for example) but having the requirement that it must drive external circuitry biased with higher voltage supplies (5.0 volts or higher). A number of circuit configurations have been developed to address this problem.

One technique widely used to allow low voltage rating transistors to interface to higher voltage is to replace single transistors, which would otherwise have to withstand full voltage stress, with stacked or cascoded multiple transistors across which the stress may be distributed. The major difficulties of prior art solutions have been the effective sensing of the failed-supply condition and the proper biasing of the cascode protection transistors to allow both the required protection in the failed-supply state, and also the correct buffer operation in the normal state. Some chip suppliers have supplied buffers which have been designed using these and other supplementary circuit techniques, yet the buffers are normally not sufficiently robust that the supplier can claim fail-safe operation. Fail-safe operation means unconditional circuit reliability after extended supply voltage failure with high voltage signal levels applied to input/output pins.

Sub-micron chips having buffers without fail-safe protection will usually suffer catastrophic failure when the normal chip supply voltage fails for an extended period, if any input, output, or input/output buffer has a positive applied external voltage in the 5.0 volt range. This failure is usually the result of a gate oxide voltage breakdown but can also result from a drain-source impressed voltage beyond normal rated limits.

Providing fully fail-safe operation for CMOS input/output buffers is an extension to or generalization of the solution a more basic problem, namely, that of providing high voltage tolerant operation in low-voltage (3.3 volt supply) CMOS. Briefly stated, 5 volt tolerant operation means that a circuit, designed for a 3.3 volt power supply, is able to drive a load or be driven from a source consisting of a resistor connected to a 5 volt power supply. Specifications for 5 volt tolerant circuits define maximum output leakage current flow in the 'high' or 'off' state, or maximum input leakage in the input 'high' state. No appreciable input circuit or output circuit degradation is permitted. Note that a 5 volt tolerant circuit specification does not guarantee protection from the more stringent fail-safe condition, namely that the circuit must not sustain degradation when the normal $V_{DD}$ supply for the circuit fails, but applied voltage up to 5 volts or higher, at the bond pad from other chips external to the chip in question persists.

Circuits which are operated from a 3.3 volt supply often have this requirement so that they can be used in systems along with circuits which are operated from a 5 volt supply. Essentially, protection for the input circuit or output circuit is derived from the placement of a series transistor protection device between the circuit being protected and the bond pad. The biasing of the gate terminals of these series protection transistors has, in prior art, been ineffective to adequately protect all transistors at the input, output or input/output interface from voltage stress exceeding $V_{OX\_MAX}$ (the maximum gate oxide voltage) in all failure modes conditions. Also, bias circuits operating in the highly irregular $V_{DD}$ failed state must be free from other conditions such as latch-up resulting from semiconductor-controlled-rectifier (SCR) action of parasitic transistors present in the device structures. These effects have also limited the application of prior art solutions.

SUMMARY OF THE INVENTION

The fail-safe CMOS buffer configuration of this invention allows external applied voltages to be applied, which are higher than the maximum gate oxide voltage rating of the transistors provided by the process, even when the integrated circuit $V_{DD}$ supply has failed, or has been turned off, resulting in zero volts applied at the normal $V_{DD}$ supply node. This fail-safe protection has as its key element a unique bias circuit which provides two outputs. The first bias, labeled BIAS, drives the gate terminals of the series protection transistors. The second bias, labeled VDF, drives the gate of another protection transistor which acts to pull the gate of the lower output transistor to a low voltage level during the $V_{DD}$ failed condition.

A special connection of stacked transistors detects the $V_{DD}$ supply voltage collapse. A unique bias voltage supply, derived from the signal pin itself, is developed which is applied to series protection transistors in the input or output buffer circuitry. This bias supply acts to drive the protection transistors in a manner which optimally minimizes the voltage impressed on the input or output devices under all conditions which could persist in the event of $V_{DD}$ supply voltage failure. Protection circuitry holds all combinations of voltage stress: gate-to-source, gate-to-drain, drain-to-source, gate-to-substrate, and source/drain-to-substrate voltages, to acceptable levels. Parasitic transistor action has also been analyzed to assure that possible destructive latch-up conditions have been eliminated.

BRIEF DESCRIPTION OF THE DRAWINGS

These and other aspects of this invention are illustrated in the drawings, in which.

DETAILED DESCRIPTION OF PREFERRED EMBODIMENTS

Providing fully fail-safe high voltage operation for low voltage CMOS input/output buffers is an extension to the solution to a more basic problem of providing high voltage tolerant operation. The term 'high voltage' is used here to describe a voltage higher than the allowable transistor gate to other terminal voltage for a given CMOS process. The term 'low voltage', by contrast, is used to refer to the usual supply voltage $V_{DD}$ applied to the integrated circuit power terminals. During the initial work on this invention, the predominant high voltage application was 5 volts for use with a CMOS low voltage $V_{DD}$ supply of 3.3 volts. Briefly stated, 5 volt tolerant operation means that a buffer can function with 5 volts applied to its bond pad terminal while the integrated circuit is powered with 3.3 volts. Specifications for 5 volt tolerant circuits define maximum current flow into the bond pad terminal of a buffer when driven with 5 volts. No appreciable degradation of this specification is allowed over the lifetime of the integrated circuit. A fail-safe input/output buffer must have no appreciable degradation of its specification over the lifetime of the device when 5 volts is applied to its output terminal (bond pad) whether $V_{DD}$ is active (3.3 volts) or failed (0 volts).

Figure 1:
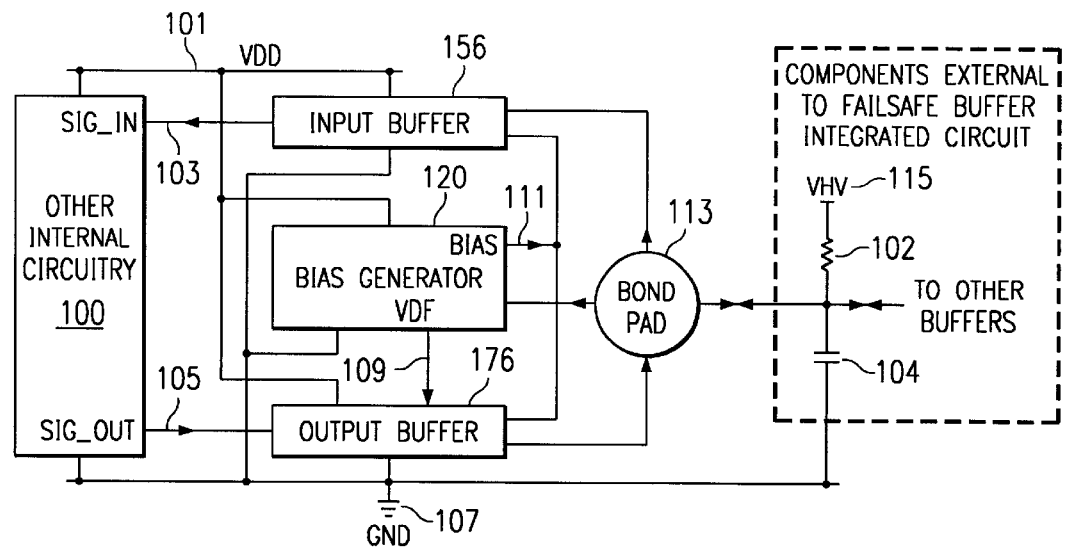
FIG. 1 illustrates a block diagram of a fail-safe input/output buffer configuration of this invention.

A block diagram of a 'fail-safe' buffer system is shown in FIG. 1. A single DC supply voltage of 3.3 volts is connected between positive terminal $V_{DD}$, node 101, and ground terminal node 107. Components that are external to the integrated circuit are shown in the dashed box. An external voltage ranging from 0 to 5 volts is applied to the bond pad of the buffer from external high voltage supply, VHV, node 115, through external resistor 102. Note that component 102 is not necessarily a resistor but can be any device that limits the current from the 5 volt external supply to the maximum value allowed in the system specifications.

External component 104 is a capacitor representing the maximum capacitive system load that an output buffer must discharge to meet its specified timing requirements in the application. Internal signals are generated in the Other Internal Circuitry block 100 which sends logic signals to an output buffer block 176 via line 105 and/or receives logic signals from an input buffer block 156 via line 103.

Consider here only the simple case of an open drain output, and a conventional input circuit without any power reduction functions in the input/output circuit. Addition of three-state output buffers with enable circuitry and power reduction circuitry would not affect the implementation of the fail-safe protection of this invention. The essential difference would be that push-pull output circuits would have not only the cascode N-channel transistor in the pull-down portion of the circuit, but would also have a series or cascode connected P-channel transistor in the pull-up portion of the circuit. Both cascode-connected transistors would be driven at their gate terminals by the bias supply circuit of this invention.

In the case of an input/output the bond pad 113 is driven by an output buffer block 176, and the bond pad also supplies a signal to an input buffer block 156, thereby functioning bidirectionally. Other buffers external to this integrated circuit may be present in the system. The voltage at the bond pad 113 will be at a level between 0 volts and 5 volts at any time, either due to the operation of output buffer block 176 or an output buffer external to the integrated circuit. The bias generator block 120 contains the circuitry that accomplishes the fail-safe operation.

This bias generator block contains a sensing circuit composed of a stacked set of transistors driven by the bond pad, and a switching circuit configuration which detects the failed condition providing proper voltages to BIAS node 111 and VDF node 109 of the internal input and/or output circuits both during normal operation and also when $V_{DD}$ is failed. The present invention differs from 5 volt tolerant circuits in that the bias generator block 120 is not present in 5 volt tolerant input and output buffers, which instead have the BIAS node at a voltage between $V_{DD}$ and ground, and the $V_{DD}$ failed signal VDF does not exist.

The Other Internal Circuitry block 100 represents the remainder of the integrated circuit components and is responsible for processing the signals to and from the input/output circuitry at this bonding pad.

Figure 2:
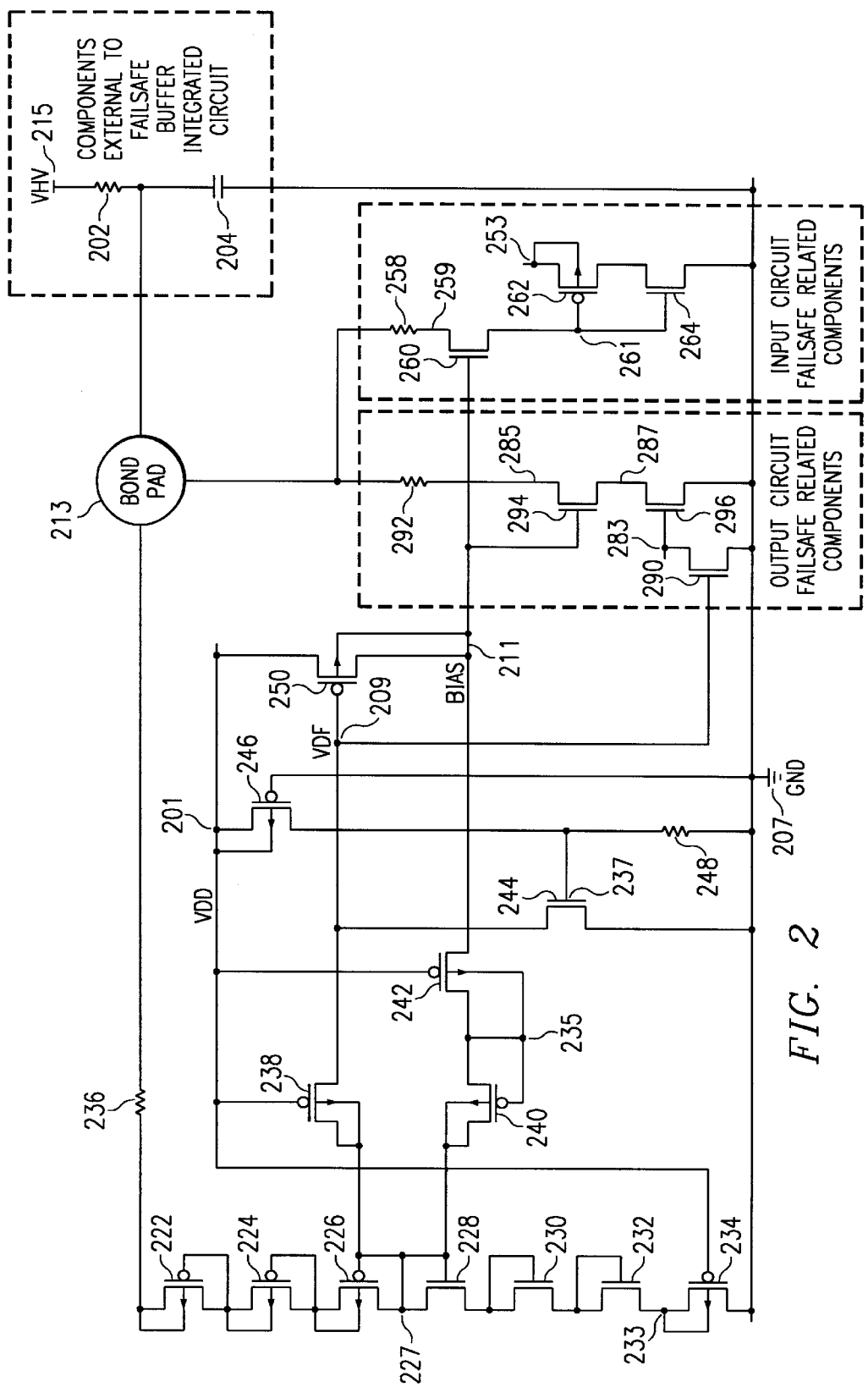
FIG. 2 illustrates the bias circuit of this invention for use in fail-safe buffer applications.

FIG. 2 contains the schematic of the bias circuit associated with the input/output circuitry at this bonding pad and just sufficient other component details to describe the operation of the fail-safe system function. The function of the bias circuit is to provide proper voltage levels, BIAS 211 and VDF 209, when the bond pad 213 is at 5 volts. These voltage levels are applied to selected components of the input and/or output buffer to allow them to withstand this voltage. When $V_{DD}$ has not failed, the correct operation of the input/output buffers must not be affected by the fail-safe bias circuitry.

Output node 283 provides the output signal from Other Internal Circuitry 100 (FIG. 1) to drive bond pad 213. Output circuit transistors 290, 294, 296, output circuit resistor 292 and input circuit transistors 260, 262, 264, input circuit resistor 258 are enclosed in properly identified dashed boxes to define them as separate from the bias circuit. Resistors 258 and 292 are included here for ESD (electrostatic discharge) protection and may not be required in all applications of this invention. The output load, dashed box components resistor 202, capacitor 204 and node 215 are external to the integrated circuit.

In the output circuit drive section transistor 294 must have its gate at BIAS node 211 maintained at a voltage level such that its drain 285 to gate voltage, and gate to source 287 voltage never exceeds $V_{OX\_MAX}$ (the maximum gate oxide voltage) and the drain 287 to ground 207 voltage of transistor 296 is less than $V_{OX\_MAX}$ whenever the bond pad 213 is at 5 volts and transistor 296 is 'off'. Note that the gate to ground voltage, can exceed $V_{OX\_MAX}$ because when the transistor is 'on' the drain/source channel is inverted and the gate oxide sees the maximum voltage potential from the gate to the source or drain. Additionally the gate of output transistor 294 must be maintained at a voltage level high enough to guarantee that the specified $V_{OL}$ (voltage output low) from the bond pad 213 to ground 207 can be met when the signal input to the gate of output transistor 296 is high, transistor 296 is 'on' and $V_{DD}$ is not 'failed'. Additionally a $V_{DD}$ failed positive voltage is output to VDF node 209 to the gate of output circuit transistor 290 whenever $V_{DD}$ is failed and the voltage on the bond pad 213 is 5 volts to assure output leakage remains low. This $V_{DD}$ failed signal and output circuit transistor 290 could be replaced with a resistor from node 283 to ground 207 which would result in additional $V_{DD}$ current when the output buffer was driving the output to a 'low' level.

Input node 253 transmits the input signal sensed from bond pad 213 to Other Internal Circuitry 100 (FIG. 1). In the input circuit section transistor 260 must have its gate at BIAS node 211 maintained at a voltage level such that the drain 259 to gate voltage and its gate to source voltage never exceeds the maximum allowed gate oxide voltage ($V_{OX\_MAX}$) and the gate 261 to ground 207 voltage on transistors 262 and 264 is less than $V_{OX\_MAX}$ volts whenever the bond pad 213 is at 5 volts. Input transistor 260 performs in a similar manner as output transistor 294. Additionally the gate of input transistor 260 must be maintained at a voltage level high enough to guarantee that when the bond pad 213 to ground 207 voltage is low ($V_{OL}$) and $V_{DD}$ is not failed, transistor 260 is 'on' and node 261 is essentially at $V_{OL}$.

Refer now to the bias switching circuit which has as its function to provide proper BIAS and VDF levels in both the normal and the $V_{DD}$ failed states.

In the $V_{DD}$ 'active' mode ($V_{DD}$=3.3 volts), transistor 246 is 'on' sourcing current through resistor 248 causing a sufficient voltage at the gate 237 of transistor 244 to turn it 'on' assuring that the voltage at VDF node 209 is essentially zero volts. In this case transistor 250 is 'on' and BIAS node 211 has a low impedance path to $V_{DD}$ (3.3 volts). Note that transistor 250 is a P-channel transistor with its source tied to BIAS node 211. This forms an active parasitic substrate PNP transistor which adds to the DC leakage current from the $V_{DD}$ supply. This connection is required to satisfy circuit operation when $V_{DD}$ is 'failed'. In this mode, the remainder of the components in the bias generator have no appreciable effect on VDF node 209 and BIAS node 211 voltages.

All P-channel devices have associated parasitic substrate PNP devices. When a P-channel device has its substrate connected to a node where the voltage can be less positive than a source/drain terminal the parasitic substrate PNP can become 'active' and thereby sustain current flow during circuit operation. Later in this document, with reference to FIG. 5, the bias generator with all possible 'active' parasitic substrate PNP devices will be described.

Transistors 234, 238 and 240 are source followers and their sources (nodes 233, 227 and 235 respectively) are required to have a voltage greater than $V_{DD}$ (3.3 volts) before they will conduct. In this mode, when the bond pad 213 is at 5 volts, current flow in the voltage divider components is through transistor 238, limiting the voltage at node 227 to 3.3 volts plus one $V_{THRESHOLD}$ (approximately 0.8 volt) of transistor 238. Transistor 234 is non-conducting, limiting the current flow in the divider chain from the bond pad 213. Any current through the divider chain when 5 volts is applied to bond pad 213 appears to the external circuits as leakage current.

When $V_{DD}$ is in the 'failed' mode (0 volts) BIAS node 211 and VDF node 209 must derive their voltage from the bond pad 213 which is assumed biased at 5 volts. The gate 237 of transistor 244 is pulled to ground by resistor 248, turning it 'off', which allows VDF node 209 to achieve a voltage level above ground. Transistor 234 is 'on' establishing a ground reference for the voltage divider chain attached to the bond pad 213. Transistors 238 and 242 will conduct if their sources (nodes 227 and 235) have a voltage one $V_{THRESHOLD}$ (approximately 0.8 volt) higher than ground.

Note that all the P-channel transistors in the 5 volt divider chain (222, 224, 226, 234, 238, 240, 242) are in isolated N-wells and have specific source/drain to N-well short orientations. Transistors 222, 224 and 226 must be P-channel transistors to limit the voltage across their gate oxides when the externally applied bond pad 213 voltage transitions from 5 volts to ground. Their orientation eliminates parasitic substrate PNP current flow when the bond pad 213 is at 5 volts and discharges node 227 to within 3 $V_{BE}$ ($V_{BE}$=base-emitter 'on' voltage of bipolar transistor) of ground when the bond pad is at 0 volts. Transistor 234 has the orientation of a source follower with a threshold one $V_{THRESHOLD}$ (approximately 0.8 volt) above $V_{DD}$. Transistor 240 guarantees that the voltage at BIAS node 211 is at least one $V_{THRESHOLD}$ (approximately 0.8 volt) lower than the voltage at VDF node 209 which guarantees that transistor 250 is 'off' presenting a high impedance path from BIAS node 211 to $V_{DD}$. Transistor 240 is oriented to prevent substrate PNP action when BIAS node 211 has a positive voltage less than one $V_{THRESHOLD}$ (approximately 0.8 volt) above the voltage at VDF. Transistors 238, 240 and 242 are oriented to make their associated parasitic substrate PNP transistors 'inactive' when the bond pad 213 is at 5 volts.

Operation of the bias generator in the $V_{DD}$ 'failed' mode is as follows. Assume the bond pad 213 is at 0 volts. Since there is no voltage stress applied to the integrated circuit transistors and no functionality is required, VDF node 209 and BIAS node 211 can be near zero volts. When the applied bond pad 213 voltage rises to 5 volts, current flows in the divider chain (including resister 236 and transistors 222, 224, 226, 228, 230, 232 and 234) establishing a voltage less than $V_{OX\_MAX}$ (maximum allowed gate oxide voltage) at node 227. The voltage at VDF node 209, the gate of transistor 250, rises faster than the voltage at BIAS node 211 ensuring that transistor 250 remains 'off' and turning 'on' output transistor 294 and/or input transistor 260. As transistors 294 and/or 260 turn 'on', capacitance is established from their drain/source nodes to their gate and the changing voltage across this capacitance causes BIAS node 211 voltage to increase to one $V_{THRESHOLD}$ (approximately 0.8 volt) above VDF node 209 at which point transistor 250 conducts to $V_{DD}$, limiting the positive excursion of the voltage on BIAS node 211. Parasitic substrate PNP action at this node also limits this voltage. The positive voltage at VDF node 209 is also applied to the gate of transistor 290 assuring that transistor 296 is held 'off'.

The divider components are designed to conduct as little as possible and still assure proper circuit operation to minimize the current drawn from the external source when it is at 5 volts. They act as forward biased diode connected transistors with very high 'on' resistance. When the externally applied voltage at the bond pad 213 transitions to zero volts, the parasitic substrate PNP transistors associated with the divider chain transistors become 'active' and reduce the voltage on the internal nodes of the bias generator.

Figure 3:
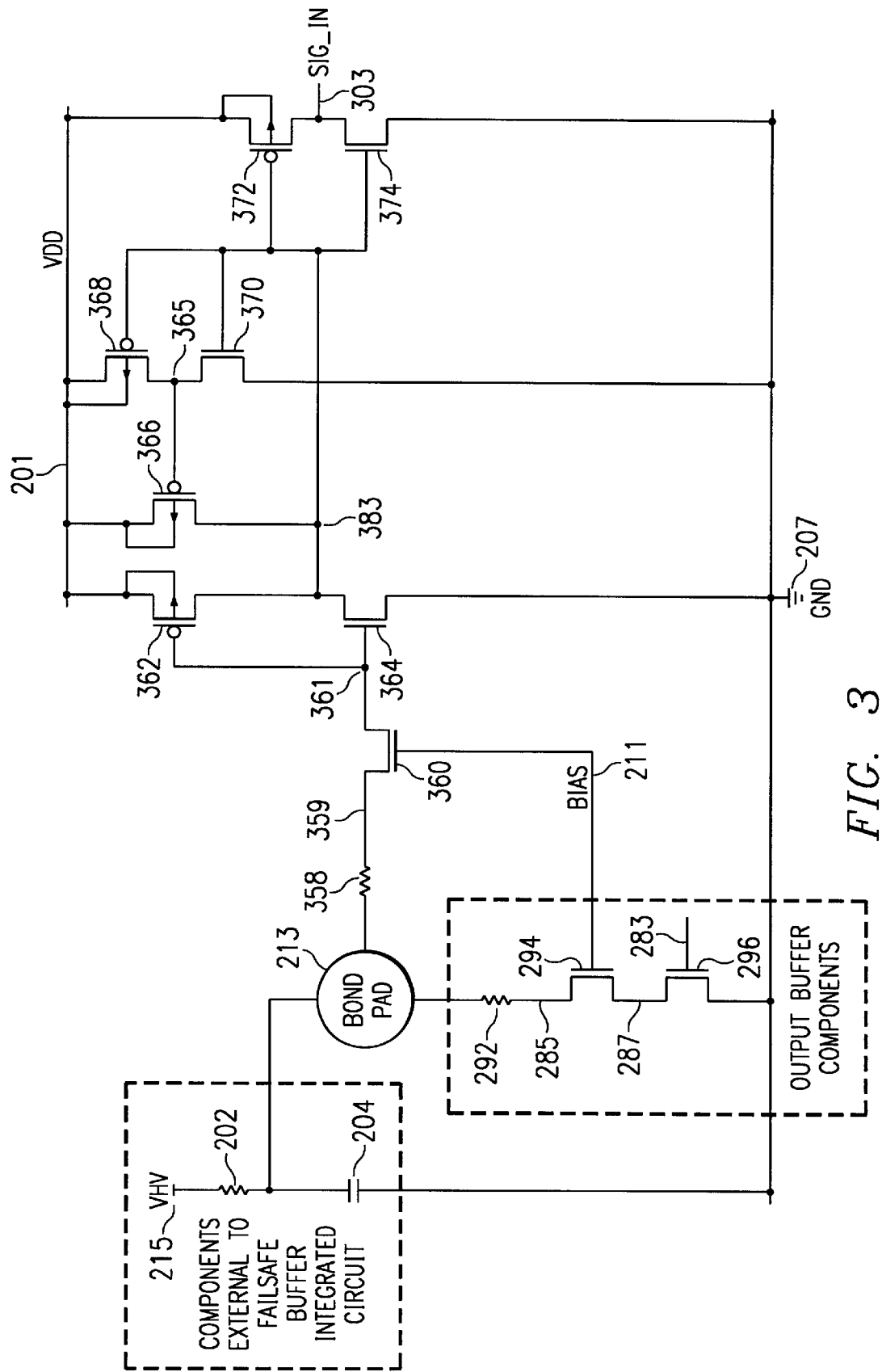
FIG. 3 illustrates the input buffer circuit which may be used in conjunction with the bias circuit of this invention in fail-safe buffer applications.

FIG. 3 illustrates the schematic of the 5 volt 'fail-safe' input buffer. Elements the same as those illustrated in FIG. 2 will have the same reference number and will not be described in detail. The 3.3 volt supply is applied between $V_{DD}$ 201 and ground 201. The 5 volt supply is applied to VHV 215 external to the integrated circuit and ground 207, which can cause 5 volts to appear on the bond pad 213, and through resistor 358 on the drain terminal 359 of transistor 360. In this design, resistor 358 is used for ESD (electrostatic discharge) protection and might not be required in all possible configurations. The gate of transistor 360 has a voltage applied from the bias generator (discussed previously) that is approximately 3.3 volts when $V_{DD}$ is not 'failed' or sufficient when $V_{DD}$ is 'failed' (zero volts) and the bond pad 213 is 5 volts to guarantee the transistor is 'on' and its drain to gate voltage is less than $V_{OX\_MAX}$ (the maximum allowed gate oxide voltage). Transistor 360 acts as a source follower whenever the voltage at the bond pad 213 is 5 volts, limiting the voltage at node 361 to a value less than the voltage on BIAS node 211 minus $V_{THRESHOLD}$ (approximately 0.8 volts), protecting transistors 362 and 364 from the external 5 volt signal levels. When $V_{DD}$ is 'active' and the bond pad 213 is zero volts, transistor 360 is 'on' and the voltage at node 361 is approximately zero volts. The action of transistor 360 driven by the bias circuit of FIG. 2 is the heart of the input circuit protection of this invention.

The conventional input circuit (not a part of the invention) is now described for clarity. Transistors 362 and 364 form an inverter circuit stage, transistors 366, 368 and 370 provide hysteresis for noise reduction and transistors 372 and 374 form a second inverter stage. The full input circuit shown is a non-inverting input buffer with output at SIG_IN to Other Internal Circuitry 100 (FIG. 1).

Figure 4:
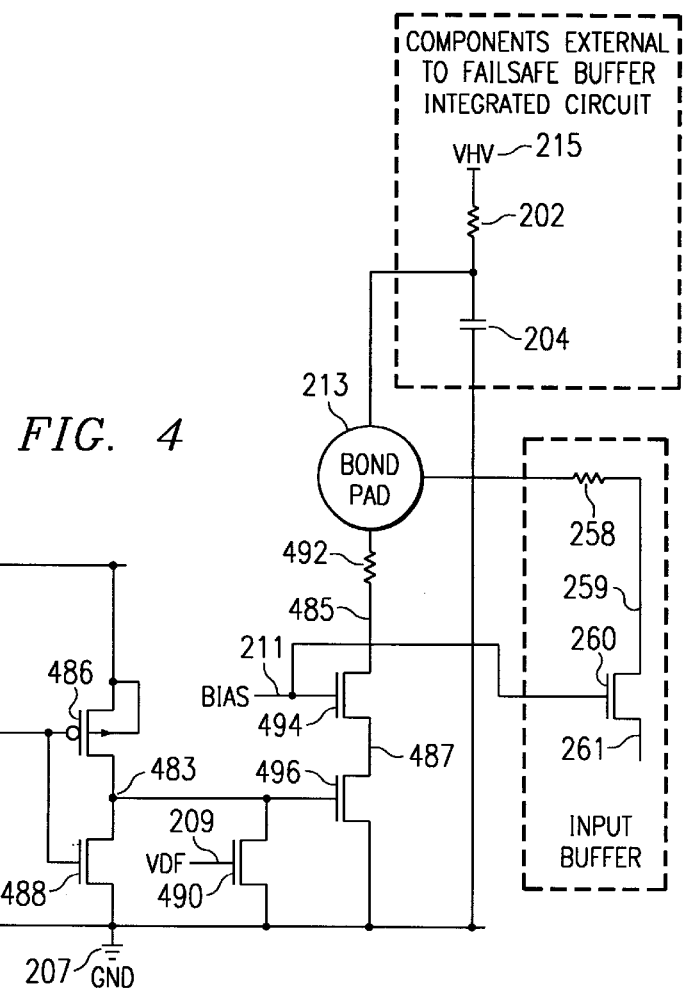
FIG. 4 illustrates the open-drain output circuit which may be used in conjunction with the bias circuit of this invention in fail-safe buffer applications.

FIG. 4 illustrates the schematic of the 5 volt 'fail-safe' output buffer. Elements the same as those illustrated in FIG. 2 will have the same reference number and will not be described in detail. The open drain output circuit comprises transistor 496 driven at its gate by internal logic and the fail-safe protection related transistor 490. Transistor 496 is protected by the action of transistor 494 driven at its gate by the bias circuit of this invention.

The 3.3 volt $V_{DD}$ supply is applied between $V_{DD}$ 201 and ground 207. The 5 volt supply is applied to VHV 215 external to the integrated circuit and ground 207, which can cause 5 volts to appear on the bond pad 213, and through resistor 492 on the drain terminal of transistor 494. In this design resistor 492 is used for ESD protection and might not be required in all possible configurations. The gate of transistor 494 has a voltage applied from the bias generator (discussed previously) that is approximately 3.3 volts when $V_{DD}$ is not 'failed' or sufficient when $V_{DD}$ is 'failed' (zero volts) and the bond pad 213 is 5 volts to guarantee the transistor 260 is 'on' and its drain 259 to gate 211 voltage is less than $V_{OX\_MAX}$ (the maximum allowed gate oxide voltage). When $V_{DD}$ is 'failed' (zero volts) and the bond pad 213 is at 5 volts transistor 496 'off' and no current flows through transistor 494, which is in the 'on' condition, to ground. When $V_{DD}$ is not 'failed' ($V_{DD}$=3.3 volts) transistor 490 is 'off' and transistor 496 will be 'on' if the voltage at its gate is 3.3 volts, resulting in its drain voltage approaching zero volts and the bond pad 213 voltage being below $V_{OL}$ (the maximum specified voltage output low). The output signal is in phase with SIG_OUT 405 in polarity but varies from 0 volts to 5 volts, whereas SIG_OUT varies from 0 volts to 3.3 volts. The action of transistor 494 driven at its gate by the BIAS output of the bias circuit of FIG. 2 of this invention and the action of transistor 490 driven at its gate by the VDF output of the bias circuit of FIG. 2 of this invention is the heart of the output circuit protection of this invention.

The three stage inverter driver comprised by transistors 478, 480, 482, 484, 486, and 488 with output at node 483 are conventional circuitry for driving an open drain output buffer and are shown for illustration only and are not part of the invention.

Figure 5:
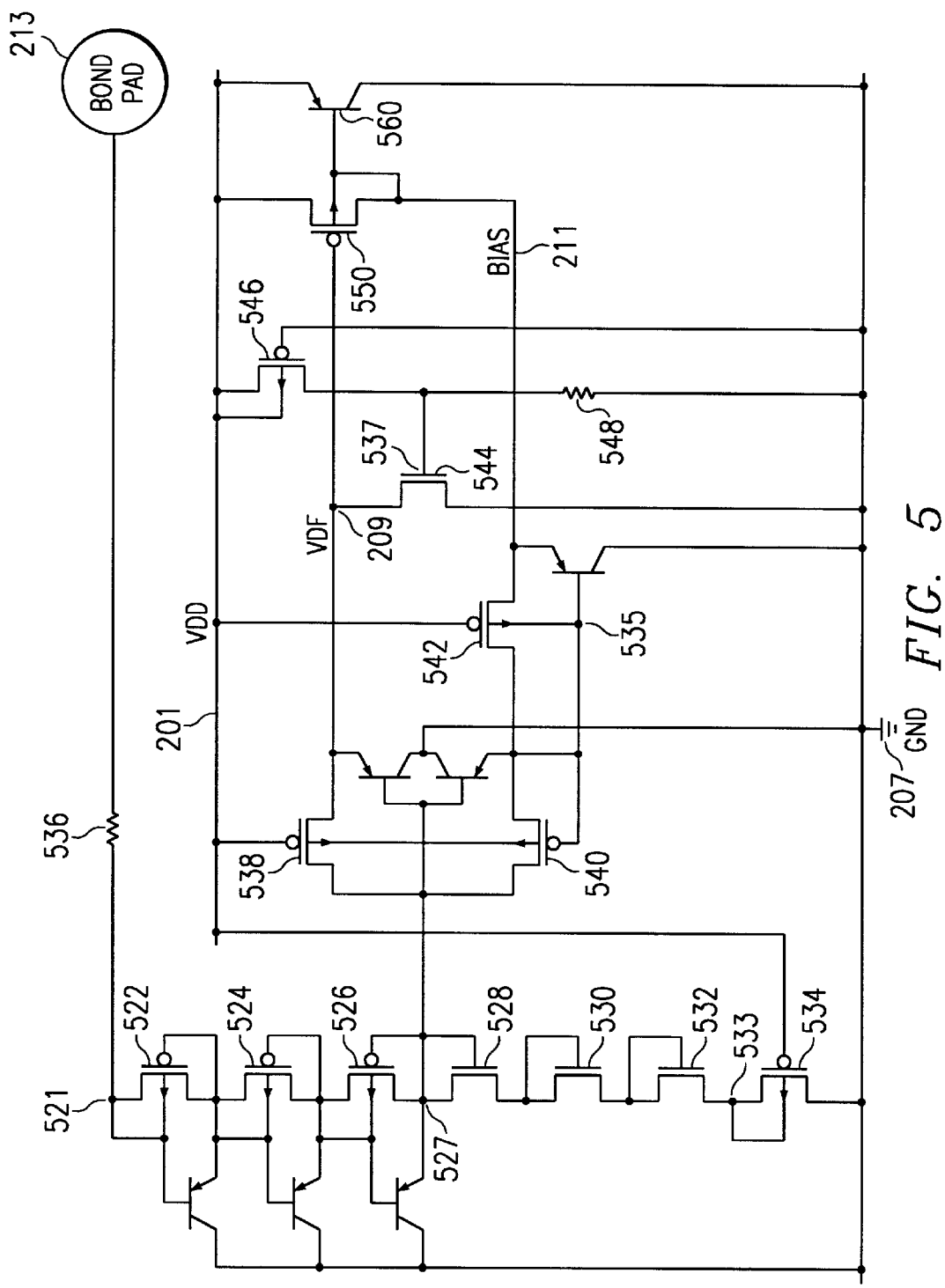
FIG. 5 illustrates the bias circuit of FIG. 2 with critical parasitic PNP transistors shown.

FIG. 5 illustrates the schematic of the bias generator of this invention showing all P-channel transistors and associated parasitic substrate PNP transistors that can become 'active' during circuit operation. The operation of the circuit was described above but now the parasitic substrate PNP transistor action will be further illustrated in the modes of circuit operation where it could occur. All P-channel devices have associated parasitic substrate PNP devices. When a P-channel device has its substrate connected to a node where the voltage can be less positive than a source/drain terminal the parasitic substrate PNP can become 'active' and thereby sustain current flow during circuit operation.

In the $V_{DD}$ 'active' mode ($V_{DD}$=3.3 volts), transistor 546 is 'on' sourcing current through resistor 548 causing a sufficient voltage at the gate 537 of transistor 544 to turn it 'on' assuring that the voltage at VDF 509 is essentially zero volts. In this case transistor 550 is 'on' and BIAS 511 has a low impedance path to $V_{DD}$ (3.3 volts). Note that transistor 550 is a P-channel transistor with its source tied to BIAS 511 which forms an active parasitic substrate PNP transistor 560 which adds to the DC leakage current from the $V_{DD}$ supply. This connection is required to satisfy circuit operation when $V_{DD}$ is 'failed'. In this mode, the remainder of the components in the bias generator have no appreciable effect on VDF 509 and BIAS 511 voltages.

Note that all the P-channel transistors in the 5 volt divider chain (522, 524, 526, 534, 538, 540, 542) are in isolated N-wells and have specific source/drain to N-well short orientations. Transistors 522, 524 and 526 must be P-channel transistors to limit the voltage across their gate oxides when the externally applied bond pad 213 voltage transitions from 5 volts to ground. Their orientation eliminates parasitic substrate PNP current flow when the bond pad 213 is at 5 volts and discharges node 527 to within 3 $V_{BE}$ ($V_{BE}$=base-emitter 'on' voltage of bipolar transistor) of ground when the bond pad is at 0 volts. Transistor 540 is oriented to prevent substrate PNP action when BIAS node 211 has a positive voltage less than one $V_{THRESHOLD}$ (approximately 0.8 volt) above the voltage at VDF node 209. Transistors 538, 540 and 542 are oriented to make their parasitic substrate PNP transistors 'inactive' when the bond pad 213 is at 5 volts.

Operation of the bias generator in the $V_{DD}$ 'failed' mode is as follows. Assume the bond pad 213 is at 0 volts. Since there is no voltage stress applied to the integrated circuit transistors and no functionality is required VDF node 209 and BIAS node 211 can be near zero volts. When the applied bond pad 213 voltage rises to 5 volts, current flows in the divider chain (including resistor 536 and transistors 522, 524, 526, 528, 530, 532 and 534) establishing a voltage less than $V_{OX\_MAX}$ (maximum allowed gate oxide voltage) at node 527. The voltage at VDF node 209, the gate of transistor 550 rises faster than the voltage at BIAS node 211 ensuring that transistor 550 remains 'off' and turning 'on' output transistor 294 (not illustrated in FIG. 5, see FIG. 2) and/or input transistor 260 (FIG. 2). As transistors 294 and/or 260 turn 'on', capacitance is established from their drain/source nodes to their gate and the changing voltage across this capacitance causes BIAS node 211 voltage to increase to one $V_{THRESHOLD}$ (approximately 0.8 volt) above VDF node 209 at which point transistor 550 conducts to $V_{DD}$, limiting the positive excursion of the voltage on BIAS node 211. Parasitic substrate PNP action at this node also limits this voltage. The positive voltage at VDF node 209 is also applied to the gate of transistor 290 assuring that transistor 296 is held 'off'. The divider components (including resistor 536 and transistors 522, 524, 526, 528, 530, 532 and 534) are designed to conduct as little as possible and still assure proper circuit operation to minimize the current drawn from the external source when it is at 5 volts. They act as forward biased diode connected transistors with very high 'on' resistance. When the externally applied voltage at the bond pad 212 transitions to zero volts, the parasitic substrate PNP transistors associated with the divider chain transistors become 'active' and reduce the voltage on the internal nodes of the bias generator.

Because of the irregular conditions which circuit nodes are exposed to under the onset of the $V_{DD}$ failed condition, analysis of the full fail-safe bias circuit operation with parasitic transistor action included in the simulation models was an essential part of the development of this invention. Special layout techniques including the practice of placing critical P-channel devices in isolated N-wells with special orientation were used.

What is claimed is:

1. A fail-safe input buffer configuration, for an integrated circuit bonding pad, comprising:
    an input circuit including an input transistor having a drain connected to the integrated circuit bonding pad, a source connected to other circuits within the integrated circuit and a gate; and
    an input bias circuit connected to a power supply and said integrated circuit bonding pad, said input bias circuit supplying a bias signal to said gate of said input transistor having a first voltage if said power supply is at its nominal level and a second voltage derived from a voltage on said integrated circuit bonding pad if said power supply has failed.

2. The fail-safe input buffer configuration of claim 1, wherein:
    said drain of said input transistor is connected to said bonding pad via a resistor.

3. The fail-safe input buffer configuration of claim 1, wherein:
    said input bias circuit includes a voltage divider circuit having a first branch connected between the integrated circuit bonding pad and a common node, a second branch connected between the power supply and said common node, and a third branch connected between said common node and ground.

4. The fail-safe input buffer configuration of claim 1, wherein:
    said input bias circuit includes:
        a set of at least two cascode connected first P-channel transistors having a first end node connected to said integrated circuit bonding pad and a second end node,
        a second P-channel transistor having a source connected to said second end node, a drain and a gate, said drain and gate connected together,
        a first N-channel transistor having a source connected to said drain of said second P-channel transistor, a drain and a gate, said source and gate connected together,
        a set of at least two cascode connected second N-channel transistors having a third end node connected to said drain of said first N-channel transistor and a fourth end node,
        a third P-channel transistor having a source connected to said fourth end node, a drain connected to ground and a gate connected to the power supply,
        a fourth P-channel transistor having a source connected to said gate of said second P-channel transistor, a drain, and a gate connected to the power supply,
        a fifth P-channel transistor having a source connected to said gate of said second P-channel transistor, a drain and a gate, said drain and said gate connected together,
        a sixth P-channel transistor having a source connected to said gate of said fifth P-channel transistor, a drain for supplying said second voltage to said gate of said input transistor and a gate connected to the power supply,
        a seventh P-channel transistor having a source connected to the power supply, a drain, and a gate connected to ground,
        a resistor having a first terminal connected to said drain of said seventh P-channel transistor and a second terminal connected to ground,
        a third N-channel transistor having a drain connected to said drain of said fourth P-channel transistor, a source connected to ground and a gate connected to said first terminal of said resistor, and
        an eighth P-channel transistor having a source for supplying said first voltage to said gate of said input transistor, a drain connected to the power supply and a gate connected to said drain of said fourth P-channel transistor.

5. The fail-safe input buffer configuration of claim 4, wherein:
    each of said first P-channel transistors, said second P-channel transistor, said fifth P-channel transistor and said sixth P-channel transistor are disposed in isolate N-wells.

6. A fail-safe output buffer configuration, for an integrated circuit bonding pad, comprising:
    an output circuit including a first output transistor having a drain connected to the integrated circuit bonding pad, a source and a gate, a second output transistor having a drain connected to said source of said first output transistor, a source connected to ground and a gate receiving a signal to be output, and a third output transistor having a drain connected to said gate of said second output transistor, a source connected to ground and a gate; and
    an output bias circuit connected to a power supply and said integrated circuit bonding pad, said output bias circuit supplying a first bias signal to said gate of said first output transistor having a first voltage if said power supply is at its nominal level and a second voltage derived from a voltage on said integrated circuit bonding pad if said power supply has failed and supplying a second bias signal to said gate of said third output transistor having a third voltage near zero if said power supply is at its nominal level and a fourth voltage derived from a voltage on said integrated circuit bonding pad if said voltage on said integrated circuit bonding pad is above zero volts and if said power supply has failed.

7. The fail-safe output buffer configuration of claim 6, wherein:
    said drain of said first output transistor is connected to said bonding pad via a resistor.

8. The fail-safe output buffer configuration of claim 6, wherein:
    said output bias circuit includes a voltage divider circuit having a first branch connected between the integrated circuit bonding pad and a common node, a second branch connected between the power supply and said common node and a third branch connected between said common node and ground.

9. The fail-safe output buffer configuration of claim 6, wherein:
    said output bias circuit includes:
        a set of at least two cascode connected first P-channel transistors having a first end node connected to said integrated circuit bonding pad and a second end node,
        a second P-channel transistor having a source connected to said second end node, a drain and a gate, said drain and gate connected together,
        a first N-channel transistor having a source connected to said drain of said second P-channel transistor, a drain and a gate, said source and gate connected together, a set of at least two cascode connected second N-channel transistors having a third end node connected to said drain of said first N-channel transistor and a fourth end node, a third P-channel transistor having a source connected to said fourth end node, a drain connected to ground and a gate connected to the power supply, a fourth P-channel transistor having a source connected to said gate of said second P-channel transistor, a drain connected to said gate of said third output transistor supplying said second bias signal and a gate connected to the power supply, a fifth P-channel transistor having a source connected to said gate of said second P-channel transistor, a drain and a gate, said drain and said gate connected together, a sixth P-channel transistor having a source connected to said gate of said fifth P-channel transistor, a drain for supplying said second voltage to said gate of said first output transistor and a gate connected to the power supply, a seventh P-channel transistor having a source connected to the power supply, a drain, and a gate connected to ground, a resistor having a first terminal connected to said drain of said seventh P-channel transistor and a second terminal connected to ground, a third N-channel transistor having a drain connected to said drain of said fourth P-channel transistor, a source connected to ground and a gate connected to said first terminal of said resistor, and an eighth P-channel transistor having a source for supplying said first voltage to said gate of said first output transistor, a drain connected to the power supply and a gate connected to said drain of said fourth P-channel transistor.

10. The fail-safe output buffer configuration of claim 9, wherein:

each of said first P-channel transistors, said second P-channel transistor, said fifth P-channel transistor and said sixth P-channel transistor are disposed in isolate N-wells.

11. A fail-safe input/output buffer configuration, for an integrated circuit bonding pad, comprising:

an input circuit including an input transistor having a drain connected to the integrated circuit bonding pad, a source connected to other circuits within the integrated circuit and a gate;

an output circuit including a first output transistor having a drain connected to the integrated circuit bonding pad, a source and a gate, a second output transistor having a drain connected to said source of said first output transistor, a source connected to ground and a gate receiving a signal to be output, and a third output transistor having a drain connected to said gate of said second output transistor, a source connected to ground and a gate; and a bias circuit connected to a power supply and said integrated circuit bonding pad, said bias circuit supplying a first bias signal to said gate of said input transistor and to said gate of said first output transistor having a first voltage if said power supply is at its nominal level and a second voltage derived from a voltage on said integrated circuit bonding pad if said power supply has failed and supplying a second bias signal to said gate of said third output transistor having a third voltage near zero if said power supply is at its nominal level and a fourth voltage derived from a voltage on said integrated circuit bonding pad if said voltage on said intergrated circuit bonding pad is above zero volts and if said power supply has failed.

12. The fail-safe input/output buffer configuration of claim 11, wherein:

said drain of said input transistor is connected to said bonding pad via a resistor.

13. The fail-safe input/output buffer configuration of claim 11, wherein:

said drain of said first output transistor is connected to said bonding pad via a resistor.

14. The fail-safe input/output buffer configuration of claim 11, wherein:

said bias circuit includes a voltage divider circuit having a first branch connected between the integrated circuit bonding pad and a common node, a second branch connected between the power supply and said common node and a third branch connected between said common node and ground.

15. The fail-safe input/output buffer configuration of claim 11, wherein:

said bias circuit includes:

a set of at least two cascode connected first P-channel transistors having a first end node connected to said integrated circuit bonding pad and a second end node, a second P-channel transistor having a source connected to said second end node, a drain and a gate, said drain and gate connected together, a first N-channel transistor having a source connected to said drain of said second P-channel transistor, a drain and a gate, said source and gate connected together, a set of at least two cascode connected second N-channel transistors having a third end node connected to said drain of said first N-channel transistor and a fourth end node, a third P-channel transistor having a source connected to said fourth end node, a drain connected to ground and a gate connected to the power supply, a fourth P-channel transistor having a source connected to said gate of said second P-channel transistor, a drain connected to said gate of said third output transistor supplying said second bias signal and a gate connected to the power supply, a fifth P-channel transistor having a source connected to said gate of said second P-channel transistor, a drain and a gate, said drain and said gate connected together, a sixth P-channel transistor having a source connected to said gate of said fifth P-channel transistor, a drain for supplying said second voltage to said gate of said input transistor and a gate connected to the power supply, a seventh P-channel transistor having a source connected to the power supply, a drain, and a gate connected to ground, a resistor having a first terminal connected to said drain of said seventh P-channel transistor and a second terminal connected to ground, a third N-channel transistor having a drain connected to said drain of said fourth P-channel transistor, a source connected to ground and a gate connected to said first terminal of said resistor, and an eighth P-channel transistor having a source for supplying said first voltage to said gate of said input transistor, a drain connected to the power supply and a gate connected to said drain of said fourth P-channel transistor.

16. The fail-safe input/output buffer configuration of claim 15, wherein:

each of said first P-channel transistors, said second P-channel transistor, said fifth P-channel transistor and said sixth P-channel transistor are disposed in isolate N-wells.

* * * * *